United States Patent
Gonatas

(10) Patent No.: US 10,079,317 B2
(45) Date of Patent: Sep. 18, 2018

(54) DEVICE FOR SMOOTHING FLUCTUATIONS IN RENEWABLE ENERGY POWER PRODUCTION CAUSE BY DYNAMIC ENVIRONMENTAL CONDITIONS

(71) Applicant: Constantine Gonatas, Concord, MA (US)

(72) Inventor: Constantine Gonatas, Concord, MA (US)

( * ) Notice: Subject to any disclaimer, the term of this patent is extended or adjusted under 35 U.S.C. 154(b) by 304 days.

(21) Appl. No.: 14/053,273

(22) Filed: Oct. 14, 2013

(65) Prior Publication Data
US 2015/0019034 A1 Jan. 15, 2015

Related U.S. Application Data

(60) Provisional application No. 61/957,865, filed on Jul. 15, 2013.

(51) Int. Cl.
*H01L 31/02* (2006.01)
*H02S 10/00* (2014.01)
(Continued)

(52) U.S. Cl.
CPC ........ *H01L 31/02021* (2013.01); *H02J 3/32* (2013.01); *H02J 3/383* (2013.01);
(Continued)

(58) Field of Classification Search
CPC ... G05B 13/02; H01L 31/02021; H02S 40/38; H02S 10/00; H02J 3/32; H02J 3/383;
(Continued)

(56) References Cited

U.S. PATENT DOCUMENTS 6,643,402 B1 * 11/2003 Okada ................ H04N 19/176
375/240.03
8,457,802 B1 6/2013 Steven et al.
(Continued)

FOREIGN PATENT DOCUMENTS

| WO | WO 2011/140565 1 | 11/2011 |
| WO | WO 2011140553 A1 | 11/2011 |
| WO | WO 2013/067213 A1 | 5/2013 |

OTHER PUBLICATIONS

Ferreira et al., "A Neural Network Based Intelligent Predictive Sensor for Cloudiness, Solar Radiation and Air Temperature", Sensors, 2012, 12(11), pp. 15750-15777 (accessed from <http://www.mdpi.com/1424-8220/12/11/15750> on Jul. 6, 2018) (Year: 2012).*

(Continued)

*Primary Examiner* — Kenneth M Lo
*Assistant Examiner* — Michael J Huntley

(57) ABSTRACT

A renewable energy generator imposes costs on a power grid from rapid fluctuations in output. A device is disclosed that collects data on renewable power production, meteorological and other information, forecasts short timescale renewable power production then mitigates costs incurred by power fluctuations by modulating the power output, while maximizing power production revenue. Mitigation may be effected by an AC/DC inverter, an energy storage system, demand response or a FACTS device. The magnitude and costs for modulating response required from energy storage, FACTS or other power modulation equipment is thereby reduced.

11 Claims, 10 Drawing Sheets

(51) Int. Cl.
*H02J 3/38* (2006.01)
*H02S 40/38* (2014.01)
*H02J 3/32* (2006.01)

(52) U.S. Cl.
CPC .............. *H02S 10/00* (2013.01); *H02S 40/38* (2014.12); *F24S 2201/00* (2018.05); *Y02E 10/563* (2013.01); *Y02E 10/566* (2013.01); *Y02E 70/30* (2013.01)

(58) Field of Classification Search
CPC ... F24J 2200/04; Y02E 10/563; Y02E 10/566; Y02E 70/30
USPC .......................................................... 700/291
See application file for complete search history.

(56) References Cited

U.S. PATENT DOCUMENTS

| | | | |
|---|---|---|---|
| 2004/0181460 A1 | 9/2004 | Bjelogrlic et al. | |
| 2007/0274596 A1* | 11/2007 | Murata | G06F 17/30793 382/209 |
| 2010/0114799 A1 | 5/2010 | Black et al. | |
| 2010/0198420 A1 | 8/2010 | Rettger | |
| 2010/0204844 A1 | 8/2010 | Rettger | |
| 2011/0103693 A1* | 5/2011 | Costes | G01W 1/10 382/190 |
| 2011/0137481 A1* | 6/2011 | Manz | H02J 7/35 700/291 |
| 2011/0276269 A1 | 11/2011 | Hummel | |
| 2011/0282514 A1* | 11/2011 | Ropp | H02J 3/383 700/297 |
| 2011/0307109 A1* | 12/2011 | Sri-Jayantha | G06Q 10/04 700/291 |
| 2012/0130556 A1* | 5/2012 | Marhoefer | H02J 3/32 700/291 |
| 2013/0258068 A1* | 10/2013 | Schmidt | H04N 7/18 348/49 |
| 2014/0039710 A1* | 2/2014 | Carter | G06Q 10/06 700/291 |

OTHER PUBLICATIONS

Teukolsky, Vetterling and Flannery; Numerical Recipes 3rd Edition: the Art of Scientific Computing [2007] (Cambridge University Press.
Soloway, Donald, Neural Generalized Predictive Control in Proceedings of the 1996 IEEE International Symposium on Intelligent Control, Dearborn MI Sep. 1996.
Ela, Erik "Effective ancillary services market designs on high wind power penetration systems" in Power and Energy Society General Meeting, 2012 IEEE, pp. 1-8. IEEE, [2012]).
Bosch, JL Solar Energy, vol. 87 [2013] p. 196.
Chow et al. Solar Energy vol. 85 [2011] p. 2881.
Marquez and Coimbra, Solar Energy vol. 91 [2013] p. 327.
Robbins and Monro [1951] Annals of Mathematical Statistics vol. 22 p. 400.
Nemirovsky et al. [2009] SIAM J. of Optimization vol. 19 p. 1574.
A. Nottrott, J. Kleissl and B. Washom [2012] 2012 IEEE Power and Energy Society General Meeting.

* cited by examiner

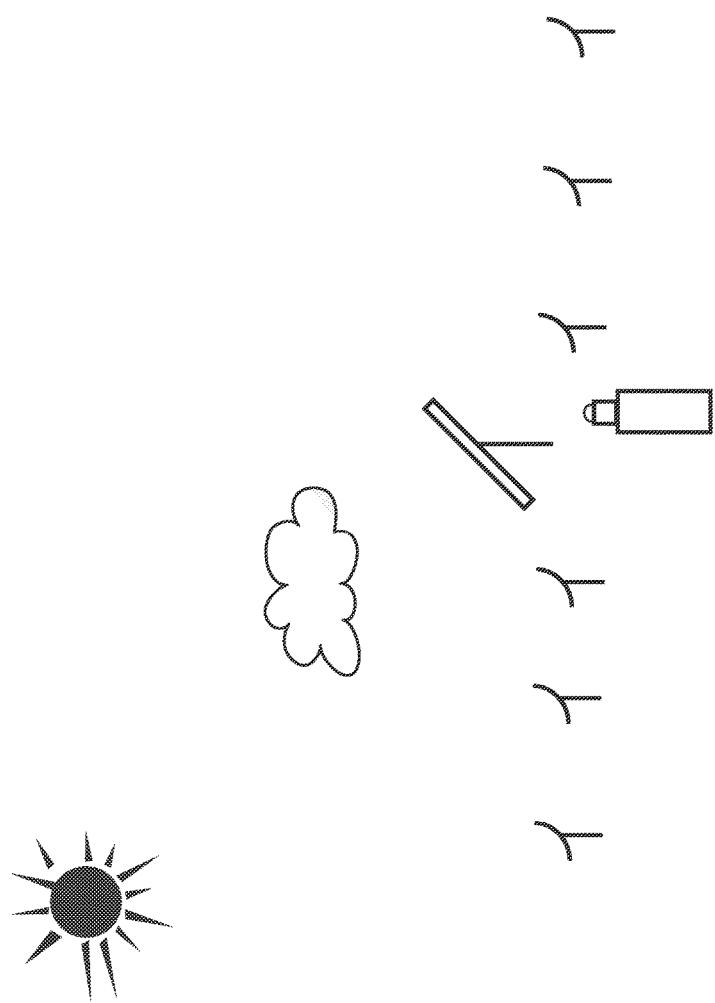

DEVICE FOR SMOOTHING FLUCTUATIONS IN RENEWABLE ENERGY POWER PRODUCTION CAUSE BY DYNAMIC ENVIRONMENTAL CONDITIONS

PRIORITY INFORMATION

This application benefits from provisional application 61/957,865 filed Jul. 15, 2013 by applicant Constantine Gonatas entitled "System for smoothing fluctuations in renewable energy power production caused by dynamic conditions," including both text and figures therein.

BACKGROUND OF THE INVENTION

The increasing adoption of renewable energy sources burdens electric grids with intermittent fluctuations in power generation. Wind generators may fluctuate significantly over a timescale of a few minutes to an hour and solar photovoltaic (PV) generation fluctuates on timescales of a few minutes or shorter. Not only must grid operators precisely balance supply with load, they must ensure voltage quality and stability, incurring additional costs by procuring ancillary services (Ela, Erik et al. "Effective ancillary services market designs on high wind power penetration systems" in *Power and Energy Society General Meeting, 2012 IEEE*, pp. 1-8. IEEE, [2012]). These are impaired by rapidly fluctuating sources of power and must be compensated by costly and limited resources such as FACTS devices, energy storage, switchable capacitor networks, tap-changing transformers and rapid-response generation operating inefficiently at partial capacity, held for regulation reserve.

The Utility Variable Integration Group was established to study the problems incurred by intermittent resources. The US National Renewable Energy Laboratory as well other studies indicate cost burdens due to intermittency ranging from several $/megawatt-hour (MWh) to over $10/MWh depending on the percentage of energy produced by variable generation. One conclusion is that forecasting changes in production will aid scheduling and lower costs. The US Federal Energy Regulatory Commission recently issued order 764, requiring wholesale variable energy generation facilities to submit meteorological forecast and operational data to grid operators in order to facilitate system management. Energy storage is now used at some sites to mitigate power fluctuations, however this is often so costly as to inhibit economic feasibility.

A method of forecasting irradiance and consequently PV energy production using a spatially extended array of irradiance sensors is disclosed by Bosch et al. (Solar Energy, vol. 87 [2013] p. 196). An alternative method uses a sky camera with a fish-eye lens at a central location images clouds to calculate a forecast based on cloud motions (Chow et al. Solar Energy vol. 85 [2011] p. 2881; Marquez and Coimbra, Solar Energy vol. 91 [2013] p. 327).

SUMMARY OF THE INVENTION

Forecasts of imminent changes in renewable power production over a first timescale or time horizon T are integrated with a device modulating net power output as to limit rapid output fluctuations that would otherwise incur costs or penalties. This process is repeated frequently over a second timescale corresponding to diurnal energy production or daily generation resource planning and scheduling.

The control device may regulate power a variety of ways, including but not limited to a power inverter or rectifier, energy storage, pumped hydroelectric storage, FACTS devices, capacitors, fast-responding diesel generation, or demand response, maximizing net revenue from power output less costs incurred by rapid fluctuations. Incurred costs may be explicit, such as charges levied by a grid operator or they may implicit, such as operating requirements needed to comply with contracts, good utility practices, or acceptable voltage levels. Applied to solar energy production, time series images of clouds are collected from a sky-ward oriented camera, or from an extended array of light sensors on a grid, together with other exogenous time series meteorological data. Because imaging data from a camera can be ambiguous due to the uncertain extent of features along the radial direction, in one embodiment data from an imaging camera are combined with data from spatially extended sensors to pinpoint feature location and velocity. The features may be fluctuations in solar irradiance such as those produced by moving clouds.

The prior history of the power output and meteorological data is analyzed in order to predict future power output on a short timescale. The predictions are then used together with site and equipment-specific operational cost constraints and prevailing power prices to determine an economic way to smooth power fluctuations. In some cases a grid operator may charge the power generator for ancillary services costs incurred by rapid fluctuations, and in other cases the grid operator may prohibit rapid fluctuations altogether.

Fluctuations themselves may be mitigated by throttling energy production, discarding thro, or by storing excess energy in a battery for discharge later. Although revenue is lost by throttling production downward, this revenue loss may be lower than the lifetime cost of a larger energy storage system. Thus some component of production throttling may be desirable in a preferred embodiment. With optimal and more effective control of an energy storage device, less storage capacity may be required to smooth fluctuations, considerably reducing capital costs.

Conversely, some storage capacity may be preferred to compensate for forecasting errors. Thereby, some storage capacity creates benefits outweighing its capital costs by mitigating output energy fluctuations that would be present if the device relied solely on forecasting and throttling energy production together with other combinations of less expensive energy control devices.

Because the penalty for permitting output fluctuations may be sizable and the power forecast may be uncertain, the preferred embodiment may control the system more conservatively, ie. throttling power downward more often than for the case of perfect forecasting. How much and how often to do so is indicated by the quality of power production forecasts, balanced with revenue loss and potential penalties incurred.

BRIEF DESCRIPTION OF THE DRAWINGS

FIG. 2A-2C is a diagram showing how the motion of a cloud can block the sunlight incident on irradiance detectors, subsequently on a photovoltaic array, and then irradiance detectors.

DETAILED DESCRIPTION OF THE INVENTION

Figure 1:
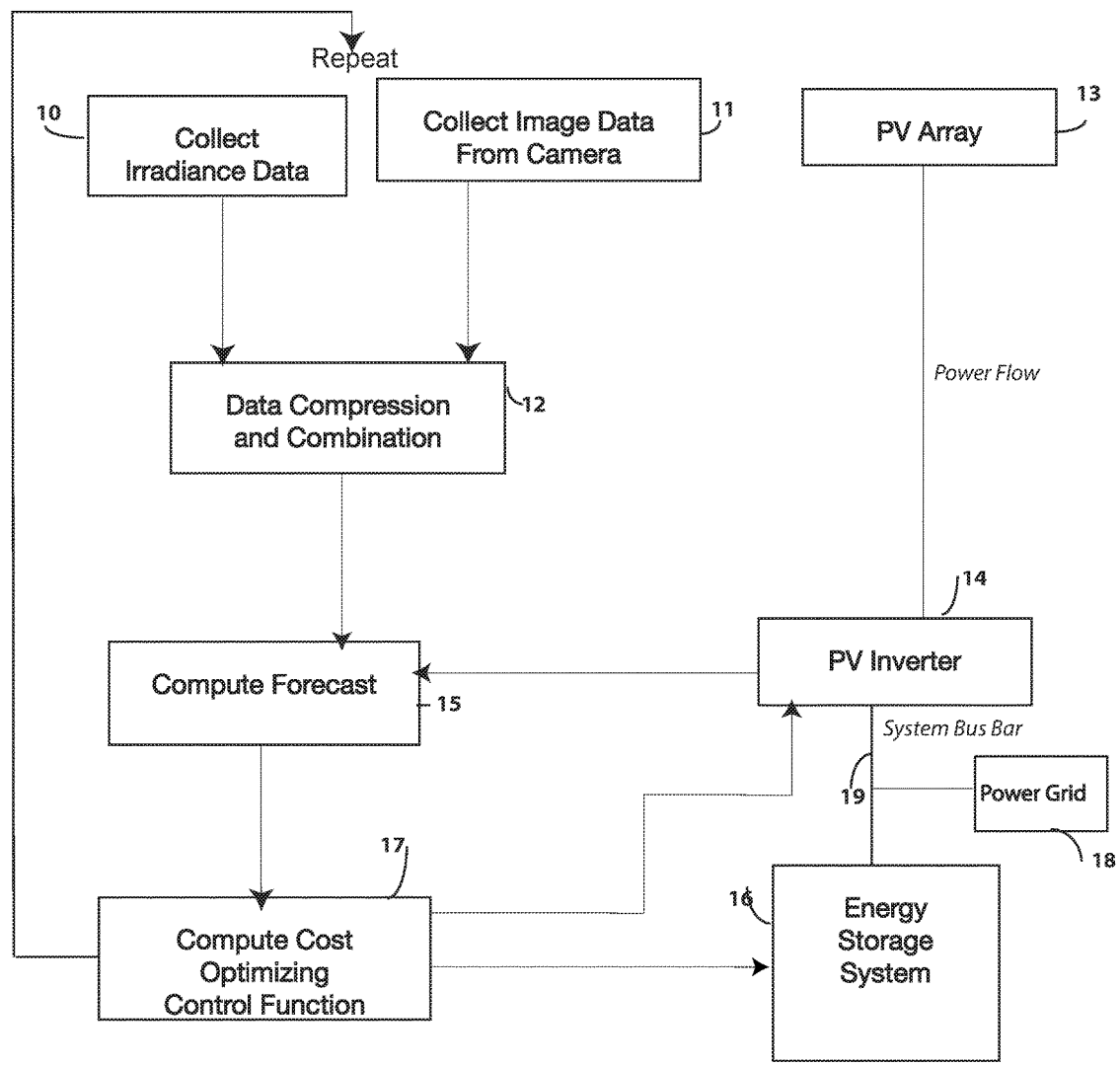
FIG. 1 is a block diagram of the invention showing how the process steps are integrated with physical equipment such as voltage inverters, an energy storage system and the electric grid.

The operation of a forecasting and PV array control system according to the invention is illustrated in FIG. 1. Either time series irradiance data is collected from a spatially extended grid of irradiance detection devices (10), or sky image data series is collected from a wide-angle sky imaging camera (11), or a combination of both. If both datasets are present they are combined by a computer and if necessary, undergo suitable data compression (13) to make further analysis computationally efficient enough so that forecasting can be performed in approximately real time.

In parallel, the PV array (13) generates DC electrical power that is converted in most applications to AC power by an inverter (14). The PV inverter provides a power output to the system bus (19), tied to the electric grid (18) and to an energy storage system (16) if present in the embodiment of the invention. The PV inverter also provides a signal output to a computer that analyzes time series of PV power levels together with the time series irradiance and sky image data to forecast future PV output levels f(t,t'), denoting the PV power production at time t' within a forecast time horizon T predicted at time t. The forecast computational step (15) is input to the control system optimization module (17), which calculates values of inverter maximum power, inverter ramp rate, energy storage charge state and charging rate, directing the inverter and energy storage systems to modify their operating parameters. In the preferred embodiment the optimization function maximizes revenue from PV power generation while minimizing the risk of incurring costs due to charges from power grid ancillary services, penalties resulting from failure to comply with ramp rate requirements, and shortened life of components eg. the energy storage system from being driven by too rapid or frequent cycling, or charging/discharging above or below the manufacturer's recommendations.

The process is continuously iterated so that at a time increment dt, new time series data are collected extending the first time interval T into the future. Preferably, the time increment dt is small compared to the time scale on which significant energy fluctuations occur. The first time interval T should be at least as long a energy fluctuation timescale. For solar energy, this is typically 3-15 minutes, for wind energy T is typically longer by a factor of a few, and generally less than a factor of 10× longer. Continuous iterations of forecasts take place over a second timescale T' may be a diurnal period or a period in which system generation resource scheduling occurs.

Figure 2A:
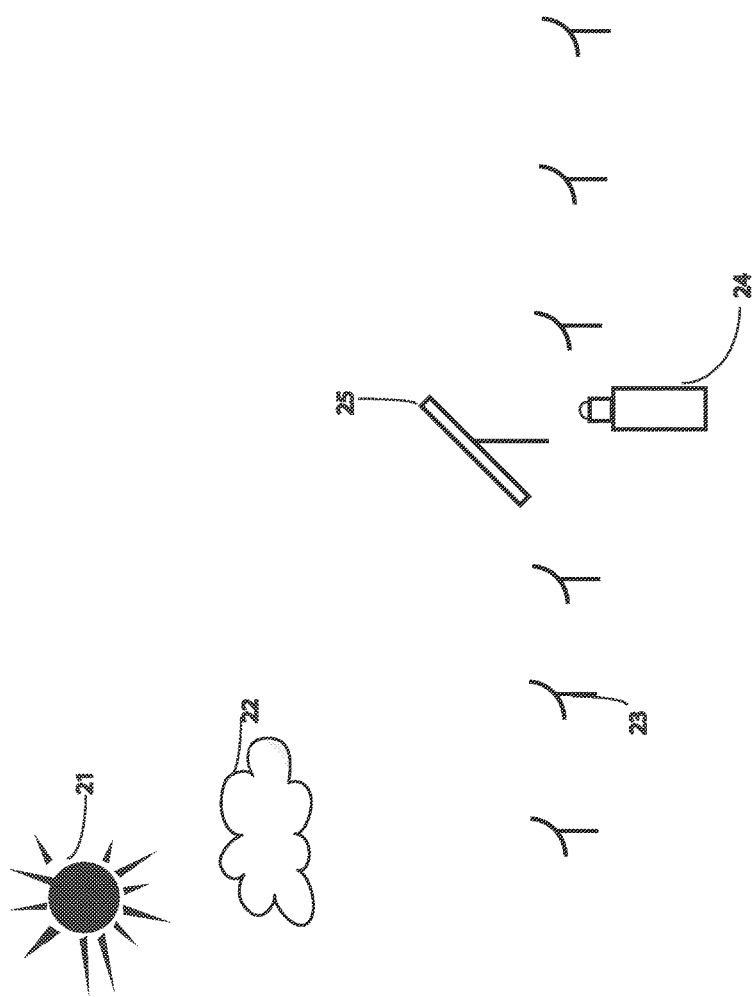

Data collection is depicted in FIG. 2. In FIG. 2a, light from the sun (21) is gathered by the PV array (25) and the line of sight between the sun and an irradiance detector (23) is blocked by a cloud (22). A sky camera (24) images and locates the cloud as well as portions of clear sky.

Figure 2C:
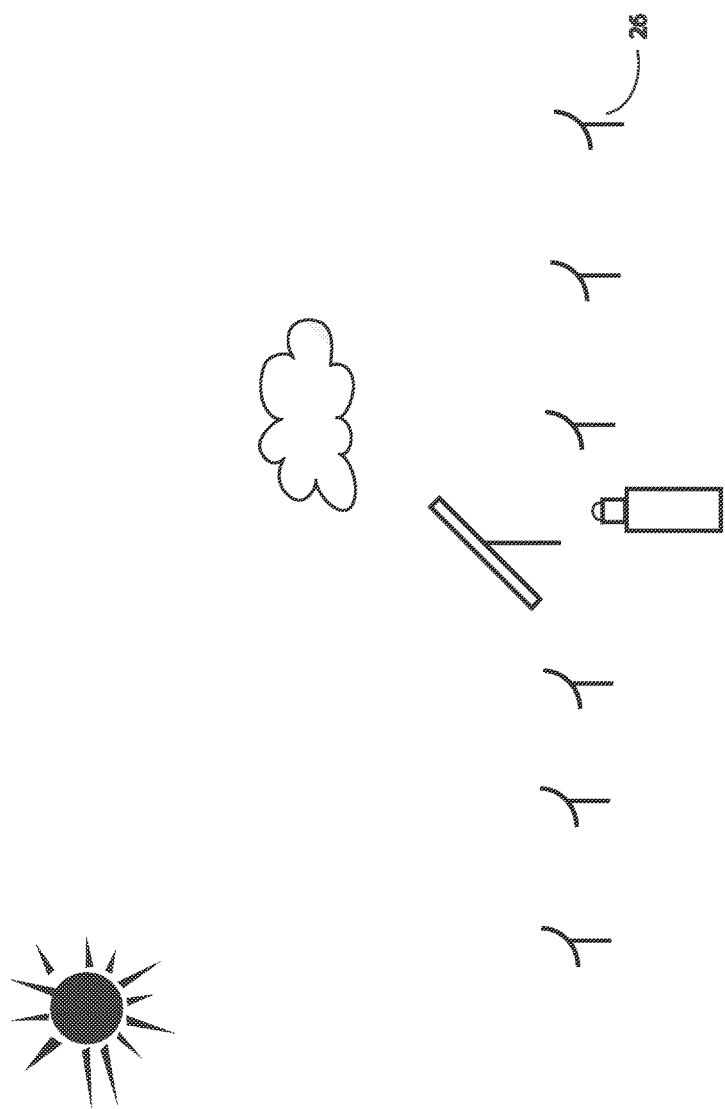

FIGS. 2b and 2c illustrate the time progression as the cloud moves. In FIG. 2b the cloud blocks the line of sight between the sun and the PV array while the line of sight between the sun and the irradiance detector is unobstructed. In FIG. 2c the cloud has moved on so that the line of sight to the PV array is again unobstructed but is now obstructing irradiance detector (26). Data collected can be interpreted to infer cloud velocity and position.

In theory, cloud transverse position and velocity can be fully determined by a spatially extended network of irradiance sensors however in practice, installing, maintaining and obtaining the land rights to install a large enough network is difficult. Conversely, a single sky imager installed near the PV array obtains a full sky image all at once, determining the projection of cloud locations on spherical coordinates. However this is not sufficient to determine cloud locations because cloud height is unknown and variations cause unpredictable changes in apparent transverse velocity.

Combining a sky camera with even a small network of a few sensors transforms the capabilities of the camera or irradiance sensors on their own because the small additional difficulty of adding a few sensors enables far more precise location determination by the cloud camera.

The camera focal plane coordinates u and v representing elevation and azimuth are related to the actual elevation and azimuth angles θ and φ by a simple transformation depending on the type of lens and curvature of the focal plane. In terms of these angles, the physical position (x, y, z) of a feature such as a cloud detected by the camera is $x = R \cos(\theta)\cos(\phi)$ $y = R \cos(\theta)\sin(\phi)$ $z = R \sin(\theta).$ R is the radial distance between the sky camera and the feature but can not be determined by the camera.

Figure 3:
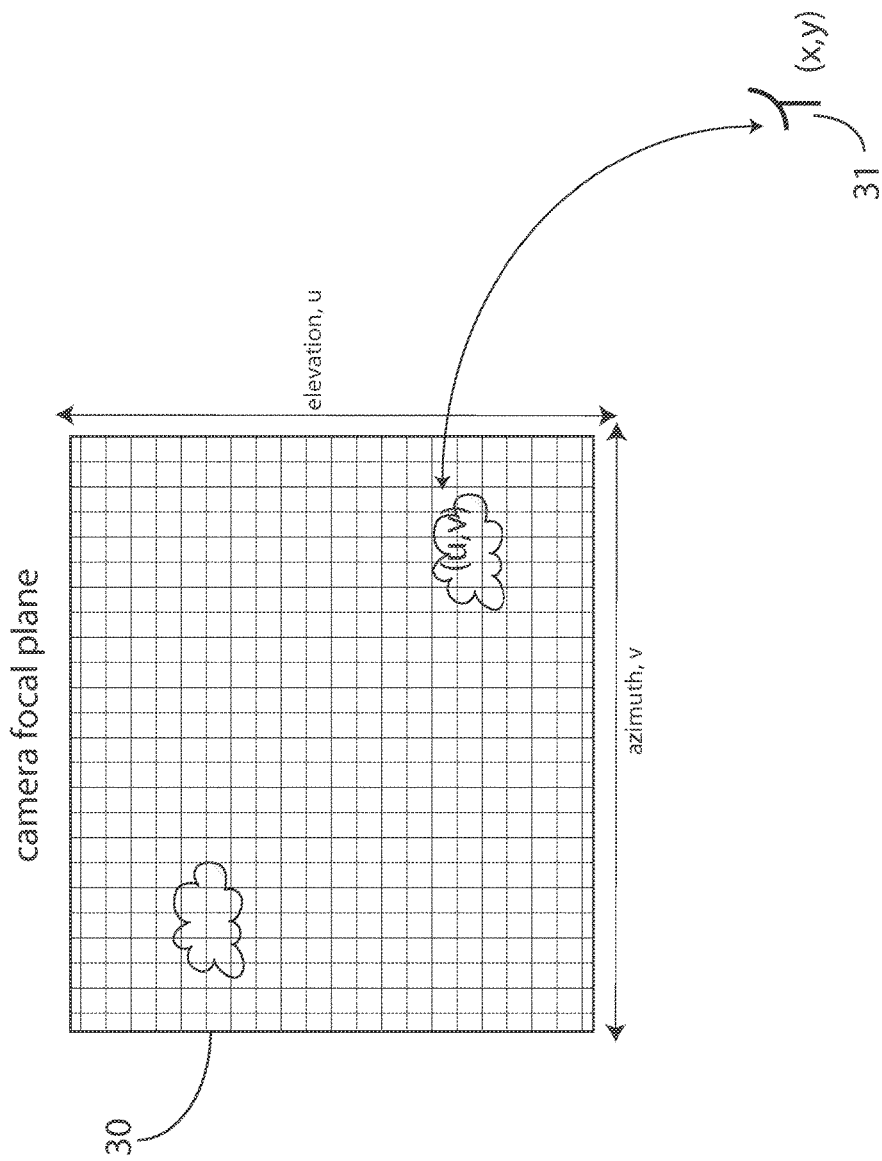
FIG. 3 shows the relationship between light collected by an irradiance detector in the field and images mapped by a sky camera.

Correlating the time series of each pixel or group of pixels from the imaging camera, FIG. 3 (30) with the time series from each of the several irradiance detectors (31) yields the position $(x_i, y_i)$ of an irradiance detector I corresponding to location $(u_i, v_i)$ of the camera focal plane, further transformed to elevation and azimuth $(\theta_i, \phi_i)$. This may change over time depending on cloud height so it is helpful to repeat the correlation continuously, using the output from several detectors to constrain the best fit correlations, using a least squares optimization technique for example.

Then the radial distance R of the feature is $$R = \frac{x_i}{\cos(\theta_i)\cos(\varphi_i)}$$

and the vertical distance for the feature detected is $$z = \frac{\sin(\theta_i)}{\cos(\theta_i)\cos(\varphi_i)}.$$

Thus feature locations can be fully determined. Heights of features that are not captured by irradiance detectors can be interpolated from locations where height location is available.

Often, the presence of noise, complex or changing cloud patterns makes point feature and velocity detection error-prone. In these circumstances alternatives such as neural network analysis help predict PV production. In a preferred embodiment, a non-linear, autoregressive network with exogenous inputs (NARX network) predicts future values of the PV production, time series f(t'), where y is the PV production level and t' is the future time of the prediction. This network is described by the function $$f(t)=g[f(t),f(t-1), \ldots, f(t-d), x_1(t), x_1(t-1, \ldots x_1(t-d),$$
$$x_2(t), x_2(t-2), \ldots x_2(t-d), \ldots x_n(t), x_n(t-1), \ldots$$
$$x_n(t-d))]. \quad (6)$$

Here, t is the present time (the time at which the prediction is made), f(t) is the present value of the production, f(t−1) is the value of the production at the previous time increment and d is the time depth of the network. Each $x_i(t)$ is a time series value of an exogenous variable, such as the output from an irradiance sensor. It may also represent the time series of values from a particular pixel or group of pixels from a sky imager, meteorological time series data such as windspeed or temperature, or operating data such as the temperature of the PV array. The network is trained on historical values of the exogenous variables and PV production over a period of time. Further, at time $t=t_0$, values of f(t) are known for all $t \leq t_0$. In addition, all actual values for training a forecast at time t'=t+dt based on values of $x_i(t)$ are known for all $t \leq t_0-dt$.

The neural network is trained on historical data for f(t) where t≤t0 together with values of $x_i(t)$ for $t \leq t_0-dt$, resulting in g[ ]. The network structure is optionally changed to a closed loop to feed back f(t) calculated for $t_0<t<t'$ into the model then predictions for f(t) where $t_0<t \leq t'$ are simulated using the model including $x_i(t)$ as inputs where $t \leq t_0$.

Available software such as *Neural Networks* (Mathematica, Champaign Ill.) or Matlab (*Neural Network User Guide*, Mathworks, Natick Mass.), *Numerical Recipes 3rd Edition: the Art of Scientific Computing* [2007] (Cambridge University Press; Press, Teukolsky, Vetterling and Flannery) contain algorithms, using Levenberg-Marquardt techniques to determine g[ ] given the training data, neural network structure, depth and forecast parameters.

The computational time increases with a large number of exogenous variables, training times and a large time depth. This creates tradeoffs between training over a large time range vs. number of pixels or time series. We trained a two level network with ten neurons per layer, with a time depth of three minutes using 30 minutes of training data and 63 input variables, resulting in sequential forecasts at a single time step in approximately five seconds using an Intel Core 2 Duo processor with a clock speed of 2.4 GHz. Other neural network types and means of manipulating input sources will be apparent to those skilled in the art.

In the preferred embodiment, before analyzing data from a multi-megapixel camera using a neural network method, a pre-processing step reduces the size of the dataset. In the simplest form, regions from the image field may be averaged together. More advanced techniques such as wavelet analysis or two-dimensional discrete cosine transforms may be used, as well as other transforms for data compression. A two-dimensional wavelet transform may be used with the top-hat, Mexican-hat or sinc function mother wavelets and is preferred for data with images of sharply defined, patchy clouds. Cosine or fourier transforms are preferred for images with fewer sharp transients.

For the cosine transform, the two-dimensional image I(u,v,t) at a single time point is converted into conjugate space $\hat{I}(\omega_1, \omega_2, t)$. For the wavelet transform, the two-dimensional image may be converted into $\hat{I}(a_1, a_2, b_1, b_2, \psi, t)$ where $\psi$ is the choice of mother wavelet. Then components are downselected choosing time series with the largest components on average over time, yielding a smaller number of components that can be analyzed in real time.

A neural network acting on direct image data I does not use or preserve the spatial relationships between point locations. Similarly, a neural network acting on transformed image data $\hat{I}$ does not use the order or transform values ($\omega_1$, $\omega_2$), or ($a_1$, $a_2$, $b_1$, $b_2$) that would be required for image reconstruction. No image reconstruction is performed and the neural network analyzes each time series blindly, determining relationships between it and the objective data without any inferences from any spatial or frequency relationship.

Thus the largest transform components may be converted to a two-dimension time series $x_i(t)$, with i being a one-dimensional vector index denoting a component number. This time series of a one-dimensional vector may be then extended along the i index with available exogenous data such as temperature, windspeed or irradiance sensor readings, synchronizing each timepoint with the time axis in the compressed image transform $x_i(t)$.

Combining neural network or other analysis methods with data compression yields the time forecast of the PV array output, f(t, t').

Consider a PV array with an operational restriction on ramp rates. A restriction may arise from a requirement imposed by a utility or grid operator that ramp rates remain below a particular limit, $R_0=|f'(t)|=|\partial f(t)/\partial t|$ where now f(t) represents the actual power production at time t as opposed to forecasted power. Another circumstance would be a requirement that unscheduled changes in production level incur ancillary service charges or demand charges for frequency or power regulation, depending potentially on the rate of change in MW/minute of power production.

Figure 4:
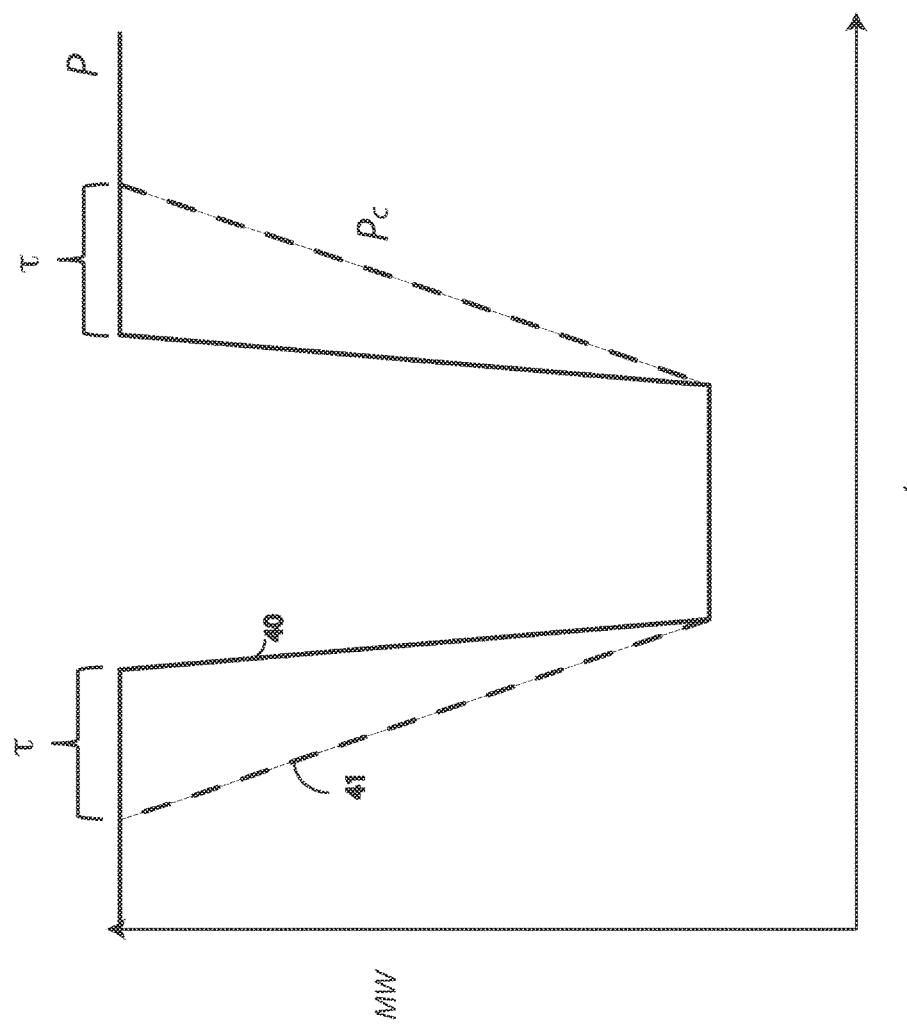
FIG. 4 compares time series data of power from an uncontrolled PV array to power from a controlled PV array

An example of a sharp ramp (40) from a variable energy generator is illustrated in FIG. 4. It could be caused by a passing cloud. The desired ramp rate (41), where $|f'(t)| \leq R_0$ may be achieved by controlling the power Pc transmitted by the PV inverter a time interval τ before anticipated drop in power generated P. As the cloud leaves, the power transmitted by the inverter increases more gradually than the actual increase in power generation P.

The inverter may modulate power transmitted through detuning the maximum power point tracking (MPPT) used to control the relationship between voltage, current and power. Advanced inverter models permit external access by a control function. The Satcon PowerGate Plus and Solstice models may permit modulating real as well as reactive power. The number stored in the inverter's Modbus register #40541, with a minimum value of 0 and maximum value of 100.0 sets the maximum percentage of power the inverter will transmit, with a default value of 100.0. Changes to this register are in turn ramped set by the rate stored in register #40542, the percent ramp rate per second.

The ramp rate register can easily slow the increase in power due to a sharp upward ramp in generated power, however a sharp drop in generated power can not be compensated without drawing on energy storage.

Figure 5:
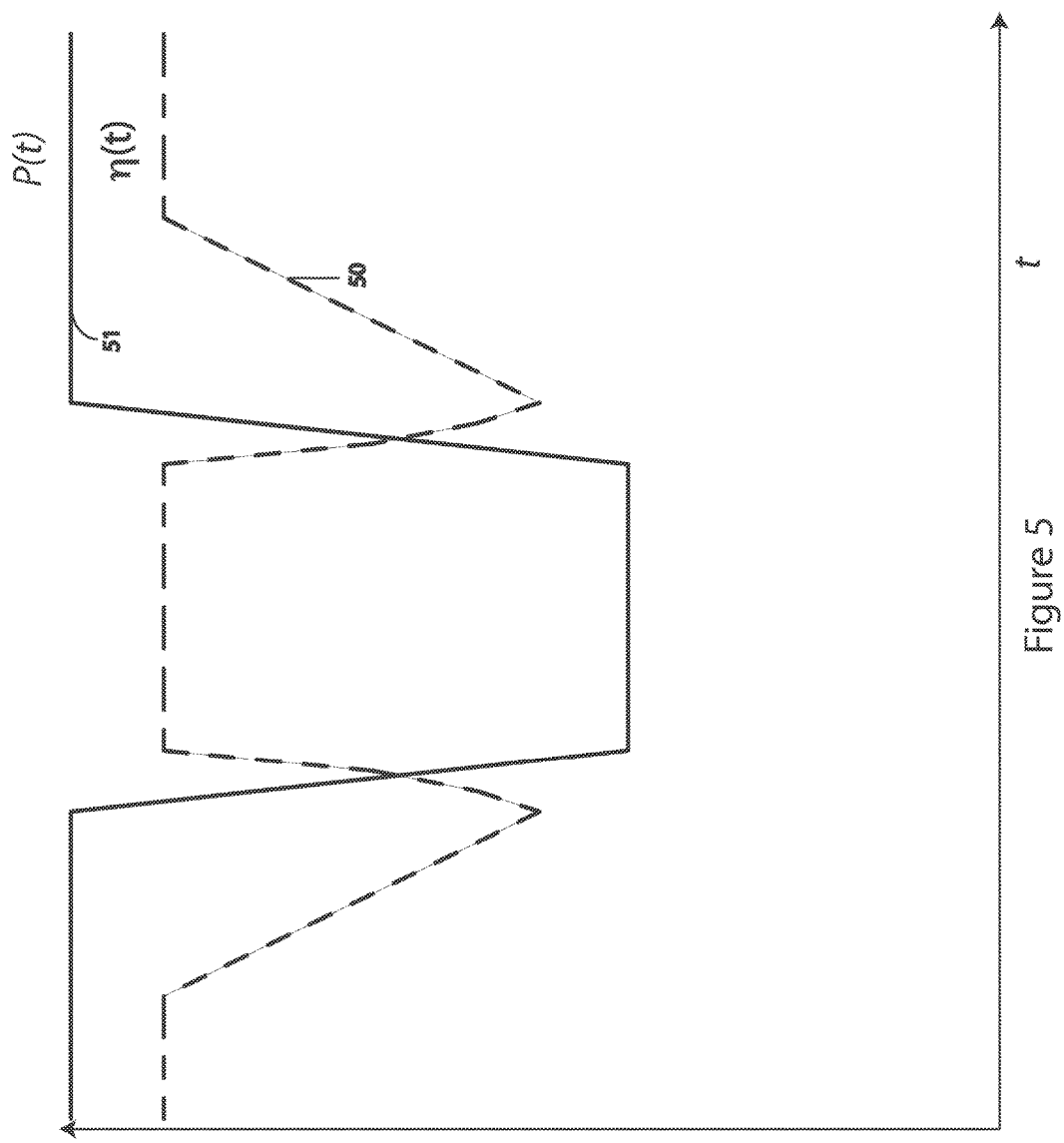
FIG. 5 shows the time evolution of power from an uncontrolled PV array and the time evolution of the control function used to modulate power by a PV inverter.

Thus inverter throughput may be determined externally by a control function, whose value is denoted by the variable η. Changes in η (50) relative to generated power P (51) are illustrated in FIG. 5. Although the transmitted power (41) decreases uniformly and reaches a trough until the cloud passes by, the control function (50) exhibits different behavior in the preferred embodiment: after decreasing uniformly in advance of the cloud cover, it increases sharply just as the cloud edge obstructs the PV array. Then just as the cloud edge stops obstructing the PV array the control function (50) decreases sharply before increasing more gradually at a uniform rate, in order to maintain the ramp rate at a level below the external constraint. This behavior prevents the transmitted power (41) from falling even more sharply as the cloud fully obscures the PV array, while increasing the economic value of power production.

For an intermittent generator connected electrically to the power grid through a device regulating power flow eg. an inverter, determining an optimal value of η(t) provides an optimal economic balance between the risks of costs from ramps and revenue from power generated. A trivial solution satisfying a fixed ramp rate constraint of course is η(t)=0 but then no power is generated. If a forecast predicts numerous power fluctuations and especially if it is error-prone, it will not be possible to determine the optimal set of values η(t) by visual inspection or heuristics. It is preferred to use a systematic procedure for optimizing operational parameters, by the economic optimization of production revenue less costs, taking operational constraints into account. Numerical techniques for constrained optimization can maximize the equation $$TNR(t) = \Sigma_{t'=t}^{T+t} f(t,t')\eta(t')Pr(t') - C(t')$$

where TNR is total net revenue over a first time period T, corresponding to the time horizon of the power production forecast, f(t,t'). The forecast f is predicted for time t' at time t, that is from observations available at time t. Preferably T is as long as the time scale on which the power production exhibits significant changes. For solar energy production it is desirable for T to be at least as long as several minutes. For an embodiment where wind energy production is predicted and controlled, it is preferred for T to be at least a significant portion of an hour.

Pr(t') is the power price received including tax credits at time t' and C(t') is a cost function incurred by exogenous conditions, such as ramps. It may be a differential function or differential equation. The optimization is performed over all parameters in the interval t≤t'≤t+T. Generally, Pr(t') will be constant over the first time interval T however there is some possibility of change over a long time interval corresponding to wind generation fluctuations.

Constraints on the optimization depend on the case-specific details of a particular device. As an example, where device control is actuated through ramping down of solar inverter throughput η, a constraint is:

$$0 \leq \eta \leq 1.$$

For a wind generator, operational control may be exercised through power rectification and synchronization equipment, mechanical feathering of turbine blades as examples.

Furthermore, the optimal solution for TNR(t') within the time interval t≤t'≤t+T must not preclude an optimization of TNR(t) within a second time interval $t_0 \leq t \leq t+T'$, where T' corresponds for example to a daily or diurnal operating schedule. The first time interval T is small compared to the second time interval T' and in a preferred embodiment is repeated frequently and rapidly, extending the time horizon T step by step throughout the second time interval T'. Predictions from short-term techniques such as cloud imaging or irradiance detectors within the first time interval T may be blended with longer term forecasts to match boundary conditions for conditions within T'.

Other examples of constraints may stem from operating requirements and restrictions. The grid operator may require that a generator pay for ancillary services in proportion to ramp rate. Then the cost function is $$C(t') = |f(t'+dt)\eta(t'+dt) - f(t')\eta(t')|R(t')/dt$$

where dt is the time increment and R(t') is the prevailing price for ancillary services to service a ramp.

In some cases, the grid operator may impose a cost such as a demand charge K for exceeding a defined ramping threshold $z_0$, the ramp threshold as a fraction of total nameplate generator output $f_0$ per unit time dt, $$C(t') = K \text{ if } \frac{|f(t'+dt)\eta(t'+dt) - f(t')\eta(t')|}{f_0 dt} \geq z_0$$

and C(t')=0 otherwise. If the grid operator or utility has an absolute requirement that ramps not exceed threshold then $z_0$ then the cost function can be represented instead as a constraint on the optimization:

$$\frac{|f(t'+dt)\eta(t'+dt) - f(t')\eta(t')|}{f_0 dt} \leq z_0.$$

Then TNR may be optimized solely as a function of η(t') with constraints on η(t') and on each finite difference element, |f(t'+dt) η(t'+dt)−f(t')η(t')|. For each of T timepoints in a time horizon there are two constraints on η(t'). Because there are (T−1) difference equations in the ramp rate constraint involving |f(t'+dt) η(t'+dt)−f(t')η(t')|, there are 2(T−1) additional constraints resulting in 4T−2 total constraints.

Numerous algorithms and software packages for optimization and constrained optimization can be used, preferably the Levenberg-Marquardt method of steepest descents which is included in Mathematica, Matlab, IDL. Normalizing the optimization process can be regularized in various ways to avoid overfitting noisy data. It will be apparent that other site-specific conditions may modify the prevailing economic and physical constraints for a generator.

The above optimization procedure repeats, preferably continuously, within the second time interval T'. Parameters determined by the optimization are retrieved from an electronic memory component, and transferred to a SCADA controller in communication with the power modulating device or inverter in order to reduce the desired power fluctuations.

Unfortunately, the forecast is subject to error and noise. For an asymmetric total net revenue function, eg. where the cost of ramping down insufficiently is larger than the revenue loss of ramping down too quickly, the optimal choice of η(t) in the presence of uncertainty will differ from the optimal η(t) if the given forecast were perfect.

Consider the calculated forecast $$f(t) = \hat{f}(t) - \in$$

where $\hat{f}$ is a perfect forecast and ∈ is a noise function. The best choice of η(t) is no longer the optimization of TRF with respect to f(t):

$$\eta(t)=O(TRF,f(t)) \Rightarrow \hat{\eta}(t)=O(TRF,\hat{f}(t))$$

where $O(F,\zeta)$ represents optimizing F with respect to the control variable $\zeta$, the same as solving the equation $$\frac{\partial F}{\partial \zeta} = 0$$

while avoiding local minima.

A straightforward but computationally expensive method of determining the optimal control function is to characterize the probability distribution of the forecasting error term, $\in$ and perform an expectation:

$$\hat{\eta}(t) = <O(TRF,f^*)>$$

where < > represents averaging over the probability distribution dp characterizing $\in$, and $f^*=f+p(\in)$ Efficient algorithms may determine the optimum by modifying the iterations in the Levenberg-Marquardt steepest descent optimization method, choosing iteration steps in such a way that the noise is averaged out (Robbins and Monro [1951] Annals of Mathematical Statistics vol. 22 p. 400; Nemirovsky et al. [2009] SIAM J. of Optimization vol. 19 p. 1574).

Figure 6:
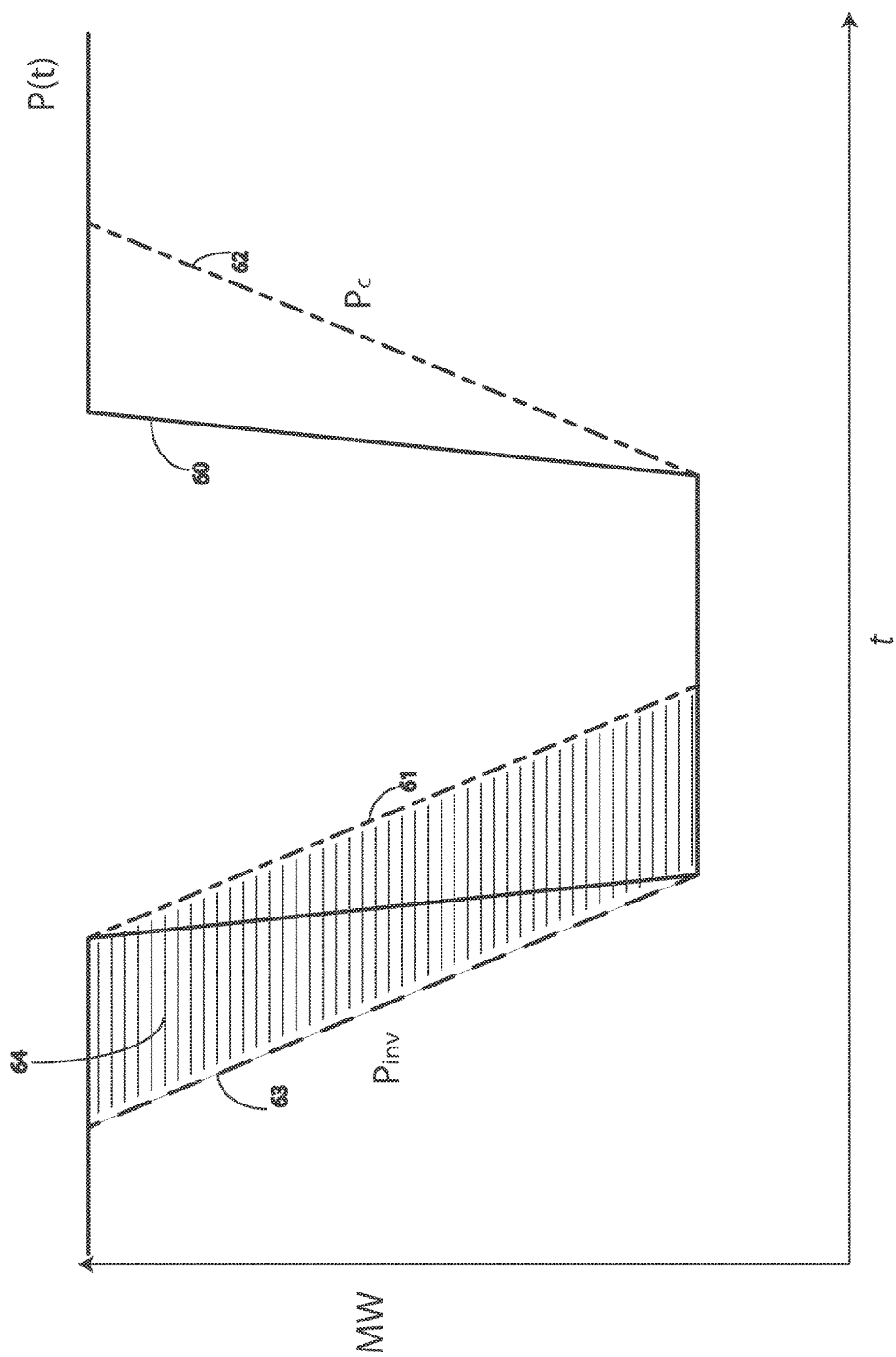
FIG. 6 compares the time evolution of power from a controlled PV array to the time evolution of power from a PV array modulated by a PV inverter alone, and to the time evolution of a PV array modulated by an energy storage system alone.

Combining an intermittent generator with an energy storage system adds complexity as well as flexibility that is beneficial when production forecasts are imperfect. FIG. 6 illustrates how discharging and recharging a battery mitigates ramps. The uncontrolled power P(t) shows a steep down ramp followed by a steep up ramp. Just as P(t) begins the down ramp, the battery discharges, providing a more gradual down ramp visible in the controlled power curve Pc (61). The steep up ramp (60) is moderated by power absorbed by recharging the battery (62).

An advantage of using an energy storage system is illustrated by comparing the controlled power ramp profile to the previous case where modulating the inverter throughput is the only method of ramp mitigation. In the inverter only case, the controlled power ramp down $P_{inv}$ (63) occurs prior to the uncontrolled ramp P(t) (60) while the battery controlled ramp down Pc begins at the same time as P(t). Both Pc and Pinv ramp up at the same time.

The energy discharged by the battery in the zone 64 represents additional PV energy production that is lost in the inverter-only case. The economic value of the additional energy production may then offset a portion or all of the battery costs. Production forecasting reduces the size and cost of battery required because the state of battery charge Q is maximized in advance of a predicted down-ramp.

According to an object of the invention, the size and cost of the battery is reduced below what would be required to mitigate ramps using a battery alone by effecting some ramp mitigation in combination with the inverter. This is economically advantageous in cases where there is a high frequency of PV generation ramps only moderately above the permitted ramp threshold and a small frequency of PV generation ramps significantly above the threshold. Even though some PV energy is lost, the frequency of loss is not enough to justify the large capital cost of energy storage.

Figure 7:
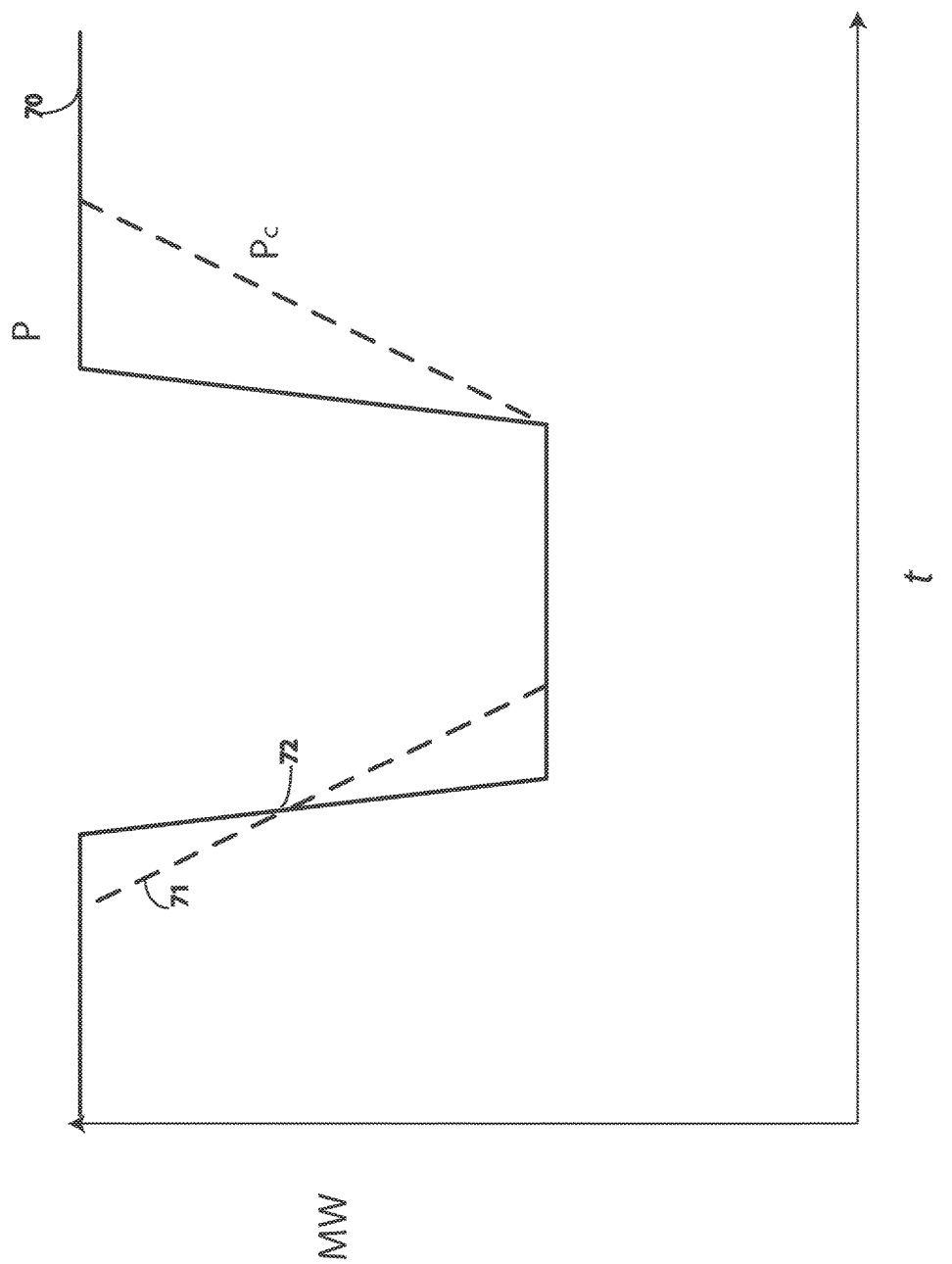
FIG. 7 compares the time evolution of power from an uncontrolled PV array to the time evolution of a PV array modulated by both a PV inverter and an energy storage system.

FIG. 7 illustrates a PV ramp event (70) where energy storage is integrated with inverter control. The inverter causes the controlled power (71) to ramp down prior to the anticipated solar energy down-ramp. Then the battery discharges to continue the same downward ramp slope while providing net positive power at a cross-over point (72). The upward ramp profile is the same as for the energy storage or inverter alone cases as the inverter and battery work together to recharge and limit upward ramps.

Figure 8:
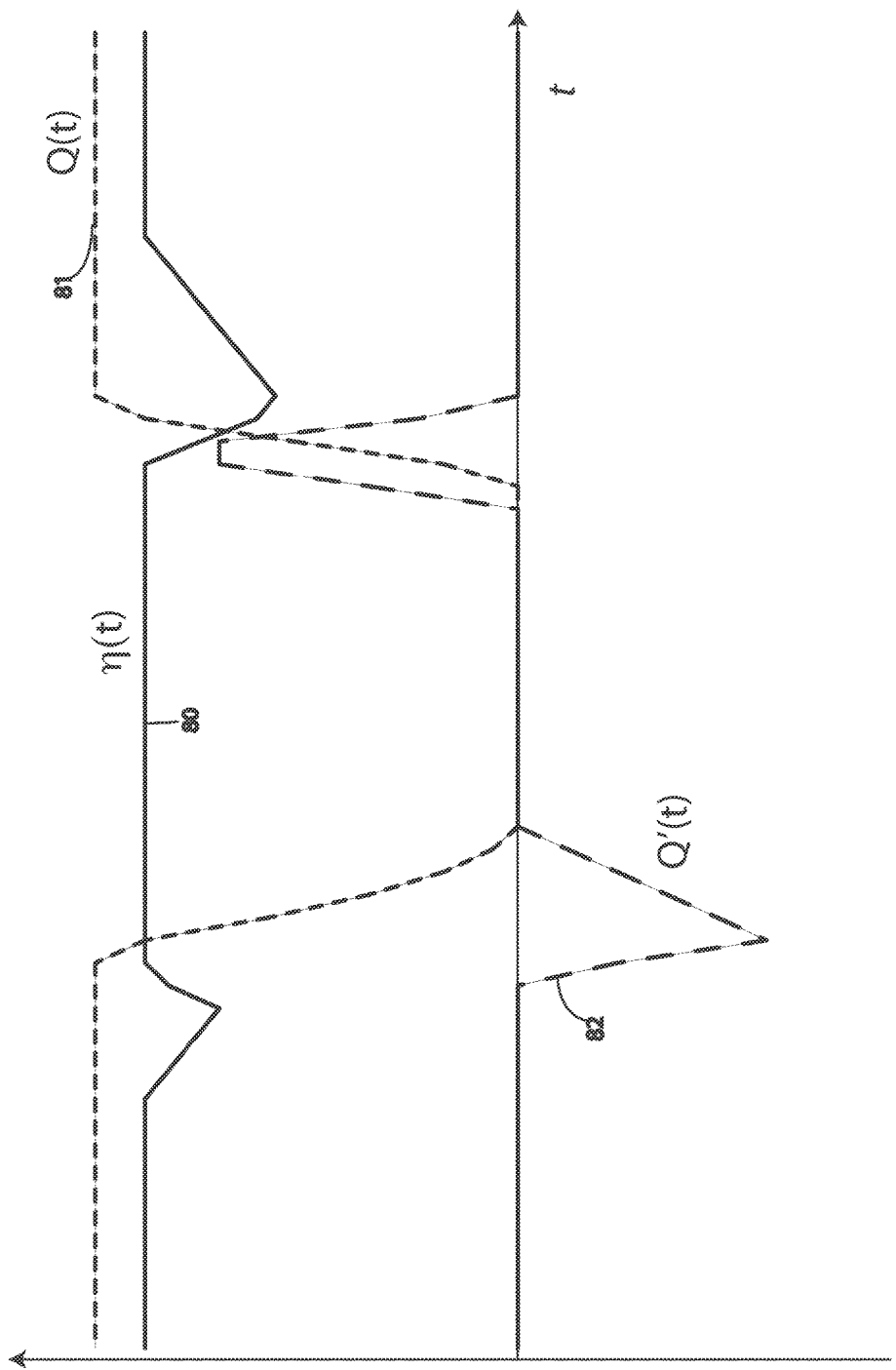
FIG. 8 shows the time evolution of power from an uncontrolled PV array and the time evolution of control signals for a PV inverter, and the time evolution of charge Q and current Q' of a controlled energy storage system working in tandem/

The combined action in the same PV ramp event is illustrated in FIG. 8. The battery state of charge Q 80 decreases after the ramp mitigation action ramps down in advance of the cloud but not nearly as much as in the inverter-alone case. The battery state of charge Q decreases in tandem to mitigate the ramp, with the output power proportional to battery current Q' (82). Then as the cloud passes, the processes reverse.

While the battery charge Q is shown to deplete completely in FIG. 8, full discharge would probably be undesirable because of the impact on battery life. Determining the optimal charge/discharge cycles in tandem with inverter control is a complex function, with additional cost parameters compared to the inverter-only case. The battery charging and power capacity is described by additional cost functions:

$C_1(Q)$ gives the incurred cost as a function of state of battery charge, approaching large numbers as $Q \to 0$ or $Q \to Q_{max}$, the maximum storage capacity;

$C_2(Q')$ gives the incurred cost as a function of current, approaching a large number as $|Q'| \to Q'_{max}$.

Power consumed by the battery $P_{bat}=h(Q,Q')$ $Q'V_{bat}$. In this embodiment the battery charges directly from the grid, not through the PV inverter. The battery efficiency is designated h; $h=h_0$ for Q'<0 (discharging) and =1 for Q'>0 (charging). The efficiency h may also be a function of temperature, battery age and number of discharge cycles, and voltage among other parameters. Typical values of roundtrip efficiency $h_0$ are approximately 90% for lithium ion batteries and less for other technologies. Then h(Q'(t)) can be written explicitly in terms of the sigmoid function, $$h(\Delta Q(t)) = \left[h_0 + \left(\frac{1-h_0}{1+e^{s\Delta Q}}\right)\right]$$

with s being a large number, making the sigmoid function cut off sharply based on the sign of $\Delta Q(t)=Q(t+dt)-Q(t)$.

$$TNR(t) = \sum_{t'=t}^{t+T} f(t,t')Pr(t')\eta(t') - $$
$$\alpha Pr(t')V_{bat}h(t')Q'(t') - C(t') - C_1(Q(t')) - C_2(Q'(t'))$$

where C(t) was given earlier as the cost function incurred by ramping over a threshold. Here the contribution or deficit to energy revenue is introduced by the term $$\alpha Pr(t')V_{bat}h(t')Q'(t)$$

noting the difference in sign with respect to the production by the PV array since increasing Q during battery charging reduces the net power delivered to the grid.

A scaling constant α (greek letter alpha) for the battery contribution to energy revenue allows de-weighting of the battery contribution to the net power production. The battery contribution to net power production is preferentially deweighted or even set to zero relative to other cost and energy factors because maximizing revenue within the first time interval T may not be consistent with maximizing revenue over the second time interval T'. For example, maximizing revenue during T may result in the complete discharge of the battery so that total revenue is maximized within T, but this action negates the possibility of further discharge for times t such that T<t<T'. This may defeat the advantages provided by a battery. Likewise, the cost term C1 may be biased so that in the absence of other driving forces, $Q \rightarrow Q_0$, preserving optionality for the battery to either increase or decrease. The optimum value of $Q_0$ may depend on the power level of renewable energy and can be estimated empirically through simulations using historical data typical for the site or even specific to the types of cloud formations, weather and power fluctuations being experienced on a particular data at the site. For example, $Q_0$ should be greater than zero when the flux of renewable energy is near a peak but should be less than the maximum charge capacity of the battery when the renewable energy flux is near zero. For values of renewable energy flux near a diurnal midpoint on a day with rapid power fluctuations, a reasonable choice would be for $Q_0$ to be somewhere near the midpoint of battery charge as to preserve optionality to either ramp up or ramp down.

$C_2(Q')$ can be re-expressed as $$C_2(Q') = C_2\left(\frac{\Delta Q(t)}{dt}\right)$$

Then $$TNR(t) = \sum_{t'=t}^{t+T} f(t')Pr(t')\eta(t') - \alpha Pr(t')V_{bat}\left[h_0 + \left(\frac{1-h0}{1+e^{-s\Delta Q}}\right)\right]\frac{\Delta Q(t')}{dt} - C(t') - C_1(Q(t')) - C_2\left(\frac{\Delta Q(t')}{dt}\right).$$

Thus Q(t) and η(t) are time series of control variables to be solved for by optimizing TNR. Function C(t) is expressed in terms of f(t), η(t), and externally imposed costs; C1(Q) and C2(Q') are also externally imposed. The optimization process again can be performed by standard Levenberg-Marquardt methods, modified to take into account forecast error if desired. Other modifications may be made to account for the incremental cost due to a round-trip cycling of the battery.

Repeated cycling of obtaining new forecasts, preferably at each time interval dt, followed by re-optimizing the control and battery state of charge functions, results in a sequence of control function states for times t within $t_0 \leq t \leq T'$ that maximize revenue while satisfying constraint functions, and smooth fluctuations in net output if desired.

The foregoing description illustrates how the predictive control of an inverter to reduce the production of solar power may increase revenue by reducing power fluctuations. Using a battery in place of the inverter to smooth out power fluctuations may achieve this but at a cost of approximately $2,000 per kW of storage power. Even so, energy storage combined with forecasting may reduce the size of battery required in methods that use the battery in a time-averaging process instead of using predictive controls.

There is a tradeoff between losing power, as with inverter control vs. energy storage preserving the power curtailed for discharge later at the considerable capital cost of the battery. Depending on the economic tradeoffs, some combination of energy storage and inverter control may result in an optimal configuration, reducing the size of battery required by as much as 50% over what could be achieved using a battery alone. This cost savings may be sufficient to make a renewable energy project economical that previously would have been infeasible.

Data in Table I indicates how using forecasts of five minutes or more provides enough advance warning so that a battery sized to 10% in power compared a PV system with a storage capacity of 15 minutes at peak power output can reduce fluctuations equally well as a battery sized to 20% of a PV system without the use of forecasts. Data in Table II indicates that combining battery controls with inverter controls can reduce the size of battery required even further

TABLE I

Compliance with 10%/minute ramp limit using battery, no inverter controls

| Battery Size % of PV Power | Forecast Time (min) | | | | | | | | |
|---|---|---|---|---|---|---|---|---|---|
| | 0 | 1 | 2 | 3 | 4 | 5 | 6 | 7 | 8 |
| 0 | N | N | N | N | N | N | N | N | N |
| 5 | N | N | N | N | N | N | N | N | N |
| 10 | N | N | N | N | N | N | ✓ | ✓ | ✓ |
| 15 | N | N | N | N | N | ✓ | ✓ | ✓ | ✓ |
| 20 | ✓ | ✓ | ✓ | ✓ | ✓ | ✓ | ✓ | ✓ | ✓ |

N = unable to smooth power fluctuations to within 10%/minute

TABLE II

Compliance with 10%/minute ramp limit using battery and inverter controls

| Battery Size % of PV Power | Forecast Time (min) | | | | | | | | |
|---|---|---|---|---|---|---|---|---|---|
| | 0 | 1 | 2 | 3 | 4 | 5 | 6 | 7 | 8 |
| 0 | N | N | N | N | N | ✓ | ✓ | ✓ | ✓ |
| 5 | N | N | N | N | N | ✓ | ✓ | ✓ | ✓ |
| 10 | N | N | N | N | N | ✓ | ✓ | ✓ | ✓ |
| 15 | N | N | N | N | N | ✓ | ✓ | ✓ | ✓ |
| 20 | ✓ | ✓ | ✓ | ✓ | ✓ | ✓ | ✓ | ✓ | ✓ |

In a further aspect of the invention, the predicted power f(t,t') represents the net power produced by renewable generation less consumption by a variable energy load L(t,t'). The load fluctuates on its own but frequently more predictably and on a longer timescale than the renewable energy production. Hence combining the two predictions results in improved accuracy for net power. Addition degrees of freedom in the optimization may be included if there is operational control over the load, as is the case for demand response (Steven, U.S. Pat. No. 8,457,802).

In another aspect, a plurality of renewable generators and loads are managed as a portfolio. Each energy generation, load and energy storage unit can be optimized with the operational parameters for each as a degree of freedom in the revenue and cost optimization procedure. This is advantageous since a portfolio of geographically diverse renewable generators will tend to have lower fluctuations as a proportion of total production than will an individual generating unit, as with load, since each generator and load is not perfectly correlated. Advantageously, energy storage capacity and/or other ancillary services provision may be further reduced.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

For example, while processes or steps are presented in a given order, alternative embodiments may perform routines having steps in a different order, and some processes or steps may be modified to provide alternatives or subcombinations. Each of these processes or steps may be implemented in a variety of different ways. Also, while processes or steps are at times shown as being performed in series, these processes or steps may instead be performed in parallel, or may be performed at different times.

Where the context permits, words in the above Detailed Description that are singular or plural may also be deemed to include plural or singular forms, respectively. The word "or," in reference to a list of two or more items, covers all of the following interpretations of the word: any of the items in the list, all of the items in the list, and any combination of the items in the list. The terms "based on," "according to," and the like are not exclusive and are equivalent to the term "based, at least in part, on," "at least according to," or the like and include being based on, or in accordance with, additional factors, whether or not the additional factors are described herein. Any patents and applications, other references and publicly available user guides or documentation noted above, including any that may be listed in accompanying filing papers, are incorporated by reference as if they were recited in full herein.

What is claimed is:

1. A device to reduce the grid impact of an intermittent energy resource, the device comprising: a forecasting system that accesses predicted future energy resource production from a renewable energy generation unit fluctuating in response to weather conditions over a time horizon T such that the time horizon T repeats over a timescale T', the timescale T' being at least two or more times longer than the time horizon T,
   wherein the time horizon T covers a plurality of time increments dt during which momentary fluctuations in energy resource production are captured,
   wherein the time horizon T is bounded by the cumulative length of the time increments dt
   such that the forecasting system obtains usable production forecasts
   for the momentary fluctuations in energy resource production, wherein the usable production forecasts are based in part on data obtained by an environmental detection unit,
   wherein the environmental data detection unit comprises an array of sensors measuring solar irradiance or a plurality of sky imaging cameras located in the vicinity of the renewable energy generation unit, and
   wherein the usable production forecasts are based in part on at least one of:
      cloud locations and heights derived from elevation and azimuth angles detected by the sky imaging cameras, and
      analysis of images detected by the sky imaging cameras performed by a neural network trained on historical sky imaging data and historical energy resource production data;
   an optimization unit that receives the usable production forecasts and calculates optimal energy resource control parameters based on the usable production forecasts by maximizing revenue less a cost function prospectively over time horizon T
   wherein the optimal energy resource control parameters are consistent with optimal operation over the time scale T', the optimization over T being within energy resource operating constraints and electric grid operating constraints;
   wherein the energy resource control parameters vary in response to variations in the predicted future energy resource production over the time horizon T,
   wherein the optimization unit modulates the energy production resource output to the electric grid based in part on the optimal energy resource control parameters, and
   wherein the optimization unit may curtail production by the renewable energy generator and wherein the optimal energy resource control parameters comprise a curtailing factor.

2. The device of claim 1, wherein the energy resource comprises a solar photovoltaic or a wind generation unit.

3. The device of claim 2, wherein either the energy resource comprises a solar photovoltaic unit
   wherein the optimal energy resource control parameters comprise parameters controlling a maximum power point tracking module, or the energy resource comprises a wind turbine unit wherein the optimal energy resource control parameters comprise parameters curtailing instant energy production.

4. The device of claim 1, wherein the energy resource comprises an energy storage resource wherein the energy resource operating constraints further comprise manufacturer's recommended limits for storage levels and discharge rates,
   wherein the optimal resource control parameters comprise charging rates or storage levels for the energy storage resource, and
   wherein the electric grid or energy resource operating constraints comprise ramp rate limitations for energy resource production output to the electric grid or the cost function comprises electric utility ramp rate charges.

5. The device of claim 4, wherein the optimization unit ensures that operation over the time horizon T is consistent with optimal operation over timescale T' in part by restricting depletion of the energy storage resource.

6. The device of claim 1, wherein the environmental data detection unit comprises an array of sensors measuring solar irradiance.

7. A method for controlling energy production from an intermittent energy resource comprising the steps of:
   accessing an energy resource production forecast covering a time horizon T and repeating over a timescale T'
   wherein the time horizon T covers a plurality of time increments dt during which momentary fluctuations in energy resource production are captured,
   wherein the time horizon T is bounded by the cumulative length of the time increments dt providing usable production forecasts for the momentary fluctuations, and
   wherein the timescale T' is at least two or more times longer than the time horizon T;
   wherein environmental data comprising cloud imaging data collected by sky imaging cameras comprises at least one of:
      cloud locations and heights derived from elevation and azimuth angles detected by the sky imaging cameras, and analysis of images detected by the sky imaging cameras performed by a neural network trained on historical sky imaging data and historical energy resource production data;

wherein the usable production forecasts are calculated based in part on the environmental data;

calculating optimal energy resource operating parameters within the time horizon T for the energy resource to maximize total net revenue less costs within energy resource and electric grid operating constraints, wherein the optimal energy resource operating parameters vary in response to the resource production forecast; and curtailing the output of the renewable energy generator based in part on the optimal energy resource operating parameters.

8. The method of claim 7, further comprising an optionality preserving process ensuring the optimal energy resource operating parameters are consistent with optimal operations over the timescale T', and wherein the optimal energy resource operating parameters further comprise storage levels or charging and discharging rates for an energy storage resource comprised within the energy resource.

9. The method of claim 8, wherein the optionality preserving process comprises biasing the storage level for the energy storage resource towards a set point $Q_0$.

10. The method of claim 9, wherein the energy resource or electric grid operating constraints comprise ramp rate limitations for power output to the electric grid or the costs include utility ramp rate charges.

11. The method of claim 7, wherein the environmental data further comprises solar irradiance data, wherein the usable production forecasts are calculated, in part, by combining cloud imaging data with solar irradiance data.

* * * * *

UNITED STATES PATENT AND TRADEMARK OFFICE
CERTIFICATE OF CORRECTION

PATENT NO. : 10,079,317 B2
APPLICATION NO. : 14/053273
DATED : September 18, 2018
INVENTOR(S) : Gonatas Page 1 of 1

It is certified that error appears in the above-identified patent and that said Letters Patent is hereby corrected as shown below:

On the Title Page

Column 1, Item (54) and in the Specification, Column 1, Lines 1-4 should read:
DEVICE FOR SMOOTHING FLUCTUATIONS IN RENEWABLE ENERGY POWER
PRODUCTION CAUSED BY DYNAMIC ENVIRONMENTAL CONDITIONS Signed and Sealed this
Thirtieth Day of April, 2019

Andrei Iancu
*Director of the United States Patent and Trademark Office*